(12) United States Patent
Gopalraja et al.

(10) Patent No.: US 6,824,658 B2
(45) Date of Patent: Nov. 30, 2004

(54) PARTIAL TURN COIL FOR GENERATING A PLASMA

(75) Inventors: Praburam Gopalraja, Sunnyvale, CA (US); Bradley O. Stimson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/211,472

(22) Filed: Aug. 1, 2002

(65) Prior Publication Data

US 2003/0051994 A1 Mar. 20, 2003

Related U.S. Application Data

(60) Provisional application No. 60/316,138, filed on Aug. 30, 2001.

(51) Int. Cl.[7] .............................................. C23C 14/34
(52) U.S. Cl. ......................... 204/298.06; 204/298.08; 204/298.11; 204/298.12
(58) Field of Search ................. 204/192.12, 298.11, 204/298.06, 298.08, 298.12

(56) References Cited

U.S. PATENT DOCUMENTS

| | | | |
|---|---|---|---|
| 5,178,739 A | * | 1/1993 | Barnes et al. .......... 204/192.12 |
| 6,254,738 B1 | | 7/2001 | Stimson et al. ......... 204/192.12 |
| 6,254,746 B1 | | 7/2001 | Subramani et al. ..... 204/298.11 |
| 6,368,469 B1 | | 4/2002 | Nulman et al. ......... 204/192.12 |
| 6,652,717 B1 | * | 11/2003 | Hong .................... 204/192.25 |
| 6,660,134 B1 | * | 12/2003 | Gopalraja et al. ...... 204/192.12 |

FOREIGN PATENT DOCUMENTS

JP    8288259    11/1996    ....... H01L/21/3065

OTHER PUBLICATIONS

Miyako, et al. "Internal-antenna driven inductive RF discharges for development of large-area high-density plasma sources with suppressed electrostatic coupling," Fifth International Symposium on Sputtering and Plasma Processes (ISSP '99), pp. 89–90.

Van Gogh, et al.: U.S. 08/857,921 filed May 16, 1997; 79 pp.

Ding: U.S. 09/039,695 filed Mar. 16, 1998; 45 pp.

Nulman, et al.: U.S. 10/052,951 filed Jan. 17, 2002; 50 pp.

* cited by examiner

*Primary Examiner*—Steven Versteeg
(74) *Attorney, Agent, or Firm*—Konrad Raynes & Victor LLP

(57) ABSTRACT

A partial turn coil disposed in a semiconductor fabrication chamber for generating a plasma and sputter depositing coil material onto a substrate can exhibit reduced RF voltages.

22 Claims, 6 Drawing Sheets

PARTIAL TURN COIL FOR GENERATING A PLASMA

RELATED APPLICATIONS

This application claims priority based on provisional application Ser. No. 60/316,138 filed Aug. 30, 2001, which is incorporated by reference in its entirety.

FIELD OF THE INVENTION

The present invention relates to plasma generators, and more particularly, to a method and apparatus for generating a plasma to sputter deposit a layer of material or to etch a layer of material in the fabrication of semiconductor devices.

BACKGROUND OF THE INVENTION

Radio frequency (RF) generated plasmas have become convenient sources of energetic ions and activated atoms which can be employed in a variety of semiconductor device fabrication processes including surface treatments, depositions, and etching processes. For example, to deposit materials onto a semiconductor wafer, substrate, or other workpiece using a sputter deposition process, a plasma is produced in the vicinity of a sputter target material which is negatively biased. Ions created within the plasma impact the surface of the target to dislodge, i.e., "sputter" material from the target. The sputtered materials are then transported and deposited on the surface of the semiconductor wafer.

Sputtered material has a tendency to travel in paths from the target to the substrate, being deposited at angles which are oblique to the surface of the substrate. As a consequence, materials deposited in etched trenches and holes of semiconductor devices having trenches or holes with a high depth to width aspect ratio, can bridge over causing undesirable cavities in the deposition layer. To prevent such cavities, the sputtered material can be redirected into substantially vertical paths between the target and the substrate by negatively charging the substrate or substrate support if the sputtered material is sufficiently ionized by the plasma. However, material sputtered in a low density plasma often has an ionization degree of less than 1% which may be insufficient to avoid the formation of an excessive number of cavities. Accordingly, in some applications, it is desirable to increase the ionization rate of the sputtered material in order to decrease the formation degree of unwanted cavities in the deposition layer.

One technique for increasing the ionization rate is to inductively couple RF energy from a coil to a plasma between the target and the workpiece. Although ionizing the deposition material facilitates deposition of material into high aspect ratio channels and vias, many sputtered contact metals have a tendency to deposit more thickly in the center of the wafer as compared to the edges. This "center thick" deposition profile is undesirable in many applications where a uniform deposition thickness is needed.

As described in U.S. Pat. No. 6,368,469, issued Apr. 9, 2002 and assigned to the assignee of the present application, it has been recognized that the coil itself may provide a source of sputtered material to supplement the deposition material sputtered from the primary target of the chamber. Application of an RF signal to the coil can cause the coil to develop a negative bias which will attract positive ions which can impact the coil causing material to be sputtered from the coil. Because the material sputtered from the coil tends to deposit more thickly at the periphery of the wafer, the center thick tendency for material sputtered from the primary target can be compensated by the edge thick tendency for material sputtered from the coil. As a result, uniformity can be improved.

As set forth in U.S. Pat. No. 6,652,717, issued Nov. 25, 2003 and assigned to the assignee of the present application, it has been recognized that the sputtering rate for material sputtered from the coil may be nonuniform around the perimeter of the coil. Hence the ability to achieve a desired level of uniformity may be adversely affected in some applications.

It has further been recognized that the coil can develop a hot spot which can cause uneven heating of the substrate. This uneven heating of the coil can also cause reliability problems in that portions of the coil may become too hot and deform, and may also cause particulates deposited on the coil to flake off and contaminate the substrate. Since single turn coils are typically required to carry a relatively high level of current, these problems can be more pronounced in such single turn coils.

SUMMARY OF THE PREFERRED EMBODIMENTS

In accordance with one aspect of the inventions, a first partial-turn coil and a second partial-turn coil are each provided within a chamber and positioned to couple energy into a central plasma generation area to generate a plasma. In addition, each coil can be adapted to sputter deposit coil material onto a substrate. In one illustrated embodiment, each partial turn coil is a half-turn coil such that the two half-turn coils may be used together to effectively surround the plasma generation area. Such an arrangement is believed to reduce the applied RF voltage across each partial-turn coil such that uniformity may be improved.

In one embodiment, the chamber has a closed ring conductive member to which an RF generator is coupled so as to define two or more partial-turn coils. In another embodiment, separate arcuate-shaped conductive members are coupled to one or more RF generators to provide separate partial-turn coils. To increase the efficiency of the generated RF electromagnetic fields, the generator or generators may be coupled to the partial turn coils in a manner which facilitates coherent currents flowing in the separate partial-turn coils.

There are additional aspects to the present inventions as discussed below. It should therefore be understood that the preceding is merely a brief summary of one or more embodiments of the present inventions. It should further be understood that numerous changes to the disclosed embodiments could be made without departing from the spirit or scope of the inventions. The preceding summary, therefore, is not meant to limit the scope of the inventions. Rather, the scope of the inventions is to be determined only by the appended claims and their equivalents.

DETAILED DESCRIPTION OF THE DRAWINGS

Figure 1:
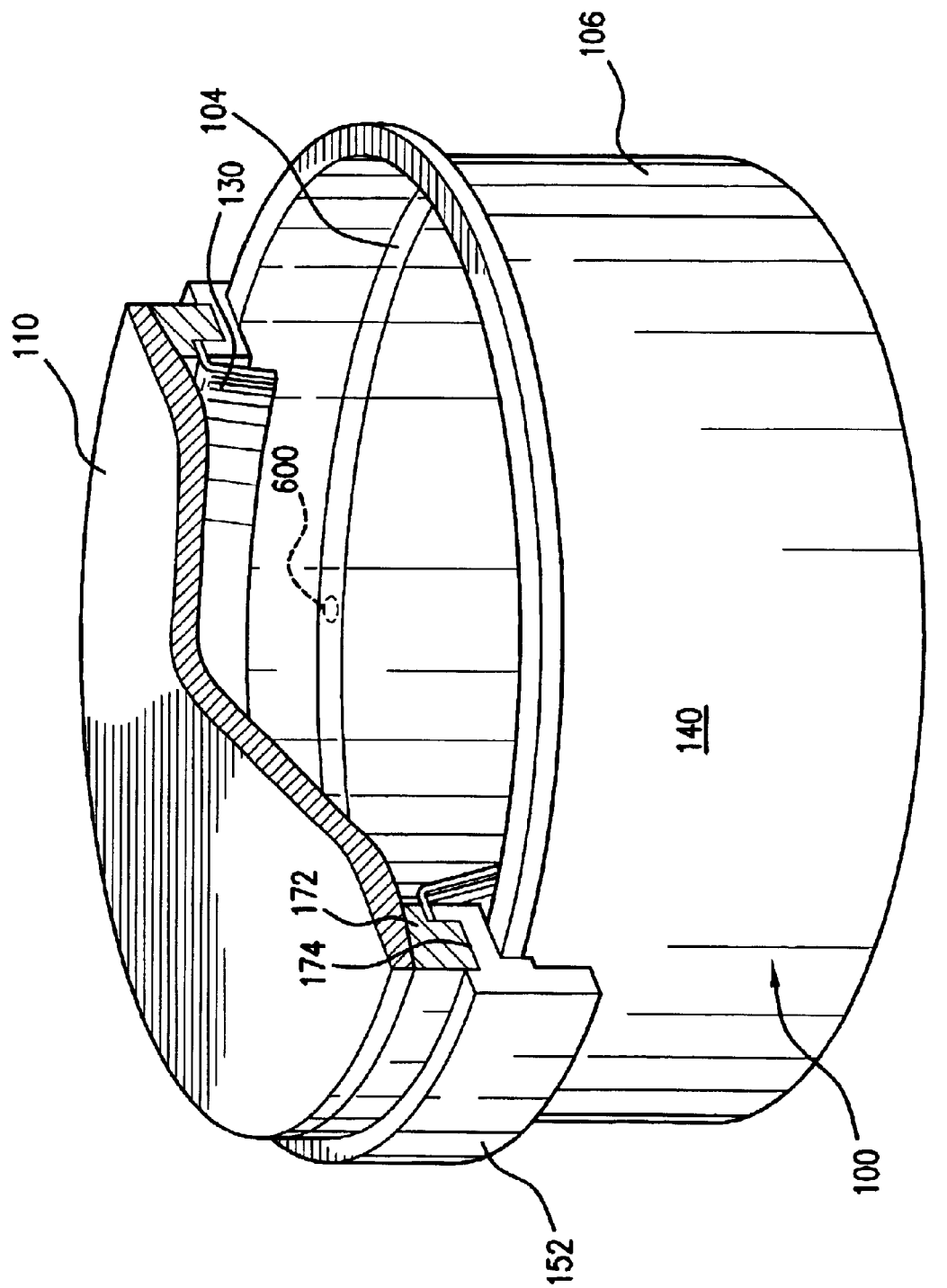
FIG. 1 is a perspective, partial cross-sectional view of a plasma generating chamber in accordance with one embodiment of the present invention.
Figure 2:
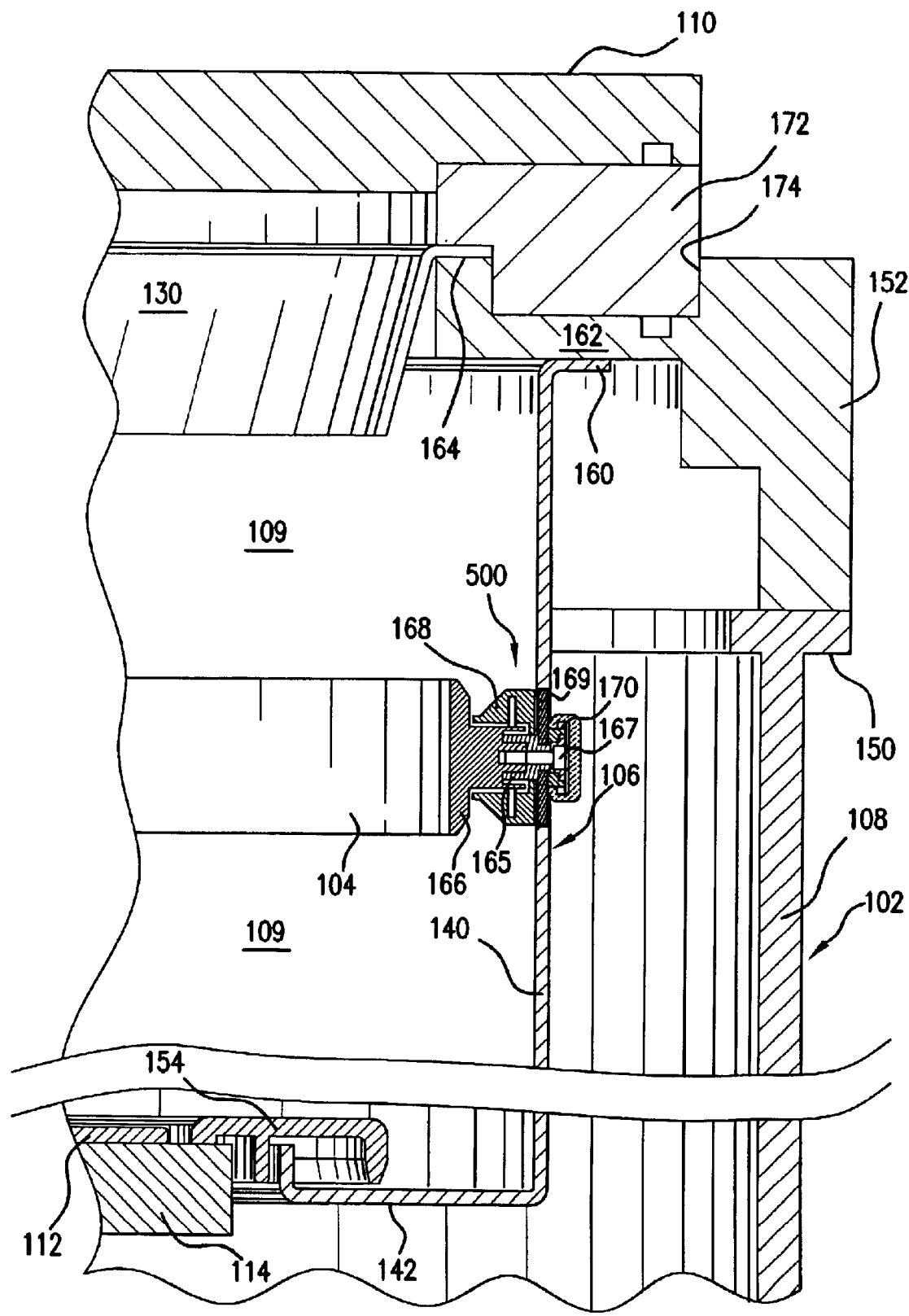
FIG. 2 is a partial cross-sectional view of the plasma generating chamber of FIG. 1 shown installed in a vacuum chamber.

Referring first to FIGS. 1–4, a plasma generator in accordance with a first embodiment of the present invention comprises a substantially cylindrical plasma generating chamber 100 which is maintainable at a low pressure below atmospheric in a vacuum chamber 102 (FIG. 2). The plasma chamber 100 in this embodiment is maintained at a near vacuum pressure and has a closed loop coil 104 which is carried internally by a shield 106. The shield 106 protects the interior walls 108 (FIG. 2) of the vacuum chamber 102 from the material being deposited within the interior of the plasma chamber 100.

Radio frequency (RF) energy from an RF generator is radiated from the coil 104 into the interior of the plasma chamber 100, which energizes a plasma including plasma within a central plasma generation area 109 (FIG. 3) of the plasma chamber 100. As explained in greater detail below, the closed loop coil 104 is electrically coupled in such a manner to function in effect as two half-turn coils. Such an arrangement is believed to reduce the magnitude of the maximum RF voltage applied across the coil. As a consequence, it is believed that the RF coil 104 and substrate 112 may be more uniformly and axially symmetrically heated, and the deposition material more uniformly sputtered from the coil.

An ion flux strikes a negatively biased target 110 positioned above the plasma chamber 100. The ions eject material from the target 110, which may then be deposited onto a wafer or other substrate or workpiece 112 supported by a pedestal 114 at the bottom of the plasma chamber 100. An optional rotating magnet assembly 116 (FIG. 3) may be provided above the target 110 to produce magnetic fields which sweep over the face of the target 110 to promote a desired erosion pattern by sputtering of the target 110.

The deposition material sputtered from the target 110 passes through the plasma energized by the coil 104 prior to being deposited on the substrate 112. A portion of the deposition material passing though the plasma is ionized by the plasma. The ionized deposition material is then attracted to a negative potential on the substrate 112. In this manner, the ionized deposition material is redirected to a more vertical path which facilitates depositing more material into high aspect ratio openings in the substrate.

Figure 3:
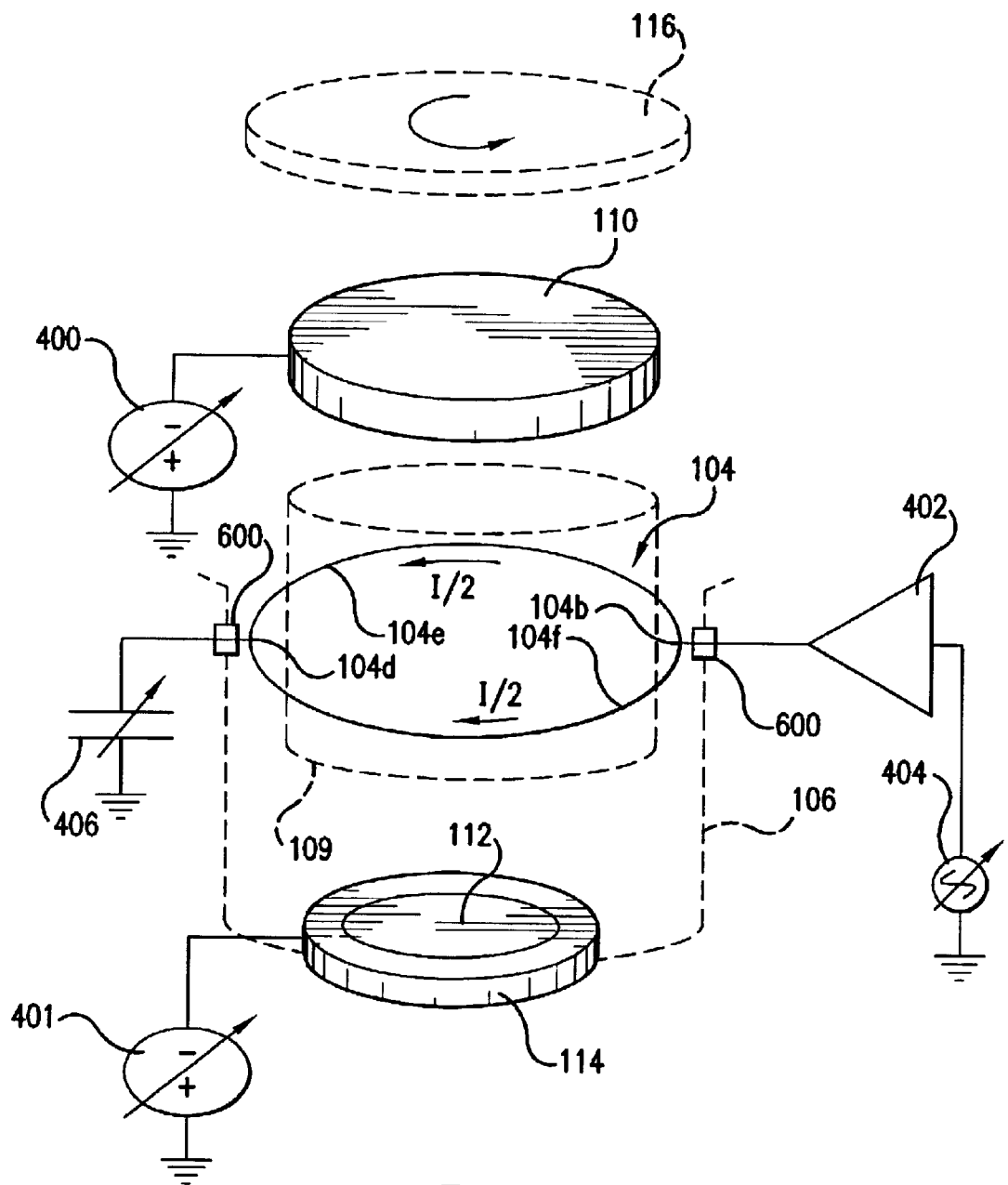
FIG. 3 is a schematic diagram of the electrical interconnections to the plasma generating chamber of FIG. 1.

Deposition material may also be sputtered from the coil 104 onto the substrate to supplement the deposition material from the target 110. The coil 104 substantially surrounds the central plasma generation area 109 (FIG. 3) which is centered in the volume between the target 110 and the pedestal 114. In the illustrated embodiment as best seen in FIG. 3, the target 110 and pedestal 114 are substantially disk-shaped such that the volume enclosing the central plasma generation area 109 is generally cylindrically shaped. The coil 104 is carried on the shield 106 by a plurality of coil standoffs 500 (FIGS. 2 and 4) which electrically insulate the coil 104 from the supporting shield 106. In addition, the standoffs 500 permit repeated deposition of conductive materials from the target 110 onto the coil standoffs 500 while inhibiting the formation of a complete conducting path of deposited material from the coil 104 to the shield 106 which could short the coil 104 to the shield 106 (which is typically at ground).

To enable use of the coil as a circuit path, RF power is passed through the vacuum chamber walls and through the shield 106 to the coil 104. Vacuum feedthroughs (not shown) extend through the vacuum chamber wall to provide RF current from a generator preferably located outside the vacuum pressure chamber. RF power is applied through the shield 106 to the coil 104 by feedthrough standoffs 600 (FIGS. 3 and 4) which like the coil standoffs 500, inhibit the formation of a complete conducting path of deposited material from the coil 104 to the shield 106.

FIG. 2 shows the plasma chamber 100 installed in the vacuum chamber 102 of a PVD (physical vapor deposition) system. Although the plasma generator of the present invention is described in connection with a PVD system for illustration purposes, it should be appreciated that a plasma generator in accordance with the present invention is suitable for use with all other semiconductor fabrication processes utilizing a plasma including plasma etch, chemical vapor deposition (CVD) and various surface treatment processes.

As best seen in FIG. 2, the plasma chamber 100 has a dark space shield ring 130 which provides a ground plane with respect to the target 110 above which is negatively biased. In addition, the shield ring 130 shields the outer edges of the target from the plasma to reduce sputtering of the target outer edges. The dark space shield 130 performs yet another function in that it is positioned to shield the coil 104 and the coil support standoffs 500 and feedthrough standoffs 600 (FIG. 3) to an extent from the material being sputtered from the target 110.

In the illustrated embodiment, the dark space shield 130 is a closed continuous ring of titanium or stainless steel having a generally inverted frusto-conical shape. It is recognized, of course, that the dark space shield may be made from a variety of other conductive materials and have other shapes which shield the coil 104 and its associated supporting structures from at least some of the material being deposited from the target.

The plasma chamber shield 106 is generally bowl-shaped and includes a generally cylindrically shaped, vertically oriented wall 140 to which the standoffs 500 and 600 are attached to insulatively support the coil 104. The shield further has a generally annular-shaped floor wall 142 which surrounds the chuck or pedestal 114 which supports the workpiece 112. A clamp ring 154 clamps the wafer to the chuck 114 and covers the gap between the floor wall 142 of the shield 106 and the chuck 114. Thus, it is apparent from FIG. 2 that the plasma chamber shield 106 together with the clamp ring 154 protects the interior of the vacuum chamber 102 from the deposition materials being deposited on the workpiece 112 in the plasma chamber 100. In an alternative embodiment, the shield 106 and dark space shield 130 may be connected together or integrally formed.

The vacuum chamber wall 108 has an upper annular flange 150. The plasma chamber 100 is supported by a vacuum chamber adapter ring assembly 152 which engages the vacuum chamber wall flange 150. The plasma chamber shield 106 has a horizontally extending outer flange member 160 which is fastened by a plurality of fastener screws (not shown) to a horizontally extending flange member 162 of the adapter ring assembly 152. The plasma chamber shield 106 is grounded to the system ground through the adapter ring assembly 152.

The dark space shield 130 also has an upper flange 164 which is fastened to the horizontal flange 162 of the adapter ring assembly 152. The dark space shield 130, like the plasma chamber shield 106, is grounded through the adapter ring assembly 152. It should be appreciated that there are numerous alternatives for supporting a shield and dark space shield within a chamber.

As explained in greater detail in application Ser. No. 09/515,880 filed Feb. 29, 2000 and assigned to the assignee of the present application (now abandoned in favor of application Ser. No. 10/733,983 filed Dec. 10, 2003), the standoff 500 includes a cylindrical electrically insulative base member 165 which is preferably made of an electrically insulative dielectric material such as a ceramic. Covering and shielding the base member 165 is a cup-shaped metal hub member 166 which is attached to the rear or outer face of the coil 104.

The hub member 166 receives a fastener member which, in the illustrated embodiment, is a bolt 167 used to secure the coil 104 to the shield wall 140. The electrically insulative base member 165 insulates the hub member 166 which is at the same RF potential as the coil 104, from the shield wall 140 which, in the illustrated embodiment, is at ground potential. The bolt 167 passes through the base member 165 such that the base member 165 also insulates the bolt 167 from the grounded shield wall 140.

The hub member 166 is spaced from the base member 165 to form a labyrinthine passageway which inhibits the formation of a path of deposition material across the standoff which could short the coil 104 to the shield 106. The standoff 500 of FIG. 4 comprises a second generally cup-shaped metal cover member 168 spaced from the cup-shaped hub member 165 to form a second labyrinthine passageway to further reduce the likelihood of the formation of a shorting conductive path.

The insulative base member 165 extends through an opening in the shield wall 140. In addition, the base member 165 extends through an opening of a retainer plate 169 and also extends through an opening of a second electrically insulative base member 170 positioned on the outer side of the shield wall 140. The bolt 167 compresses the insulative base member 165, the retainer plate 169 on one side as the bolt 167 is threaded into the hub member 166. In this manner, tightening the bolt 167 compresses the assembly of the standoff 500 together to insulatively secure the standoff and coil 104 to the shield wall 140.

The first electrically insulative base member 165 electrically insulates the hub member 166 of the coil 104 and the bolt 167 from the grounded shield wall 140. However, the base member 165 is preferably formed from an electrically insulative material which is also a good thermal conductor. The RF coil 104 may generate substantial heat which can be thermally coupled by the electrical insulator base member 165 to the wall 140 of the shield 106 to be dissipated. In the illustrated embodiment, the base member 165 is formed from an aluminum nitride ceramic material. Other electrically insulative materials may be used but it is preferred that the material be a good thermal conductor as well. Additional electrically insulative materials include aluminum oxide ceramic and quartz.

The insulative base member 170 may be made of electrically insulative materials including ceramic materials such as aluminum oxide. Alternatively, electrically insulative materials which are also good thermal conductors may be used, such as aluminum nitride ceramics.

The coil 104 and the hub members 166 of the coil 104 are preferably made of the same material which is being deposited. Hence, if the material being deposited is made of titanium, the hub member 166 is preferably made of titanium as well. To facilitate adherence of the deposited material (here for example, titanium), exposed surfaces of the metal may be treated by bead blasting which will reduce shedding of particles from the deposited material. Besides titanium, the coil and target may be made from a variety of deposition materials including aluminum, tantalum, copper, chromium, platinum, nickel, palladium, and tungsten. As explained in greater detail in the aforementioned application Ser. No. 09/515,880, the RF feedthrough 600 may be constructed in a similar fashion. The connection points at which the RF feedthroughs connect to the coil may have a variety of shapes including holes or recesses in the coil in which a bolt or other suitable RF current carrying member of the feedthrough connects to the coil.

The target 110 is generally disk-shaped and is also supported by the adapter ring assembly 152. However, the target 110 is negatively biased and therefore should be insulated from the adapter ring assembly 152 which is at ground. Accordingly, seated in a circular channel formed in the underside of the target 110 is a ceramic insulation ring assembly 172 which is also seated in a corresponding channel 174 in the upper side of the target 110. The insulator ring assembly 174, which may be made of a variety of insulative materials including ceramics, spaces the target 110 from the adapter ring assembly 152 so that the target 110 may be adequately negatively biased. The target, adapter and ceramic ring assembly are provided with O-ring sealing surfaces (not shown) to provide a vacuum tight assembly from the vacuum chamber flange 150 to the target 110.

FIG. 3 includes a schematic representation of the electrical connections of the plasma generating apparatus of this illustrated embodiment. To sputter target material onto the substrate 112, the target 110 is preferably negatively biased by a variable DC power source 400 to attract the ions generated by the plasma. In the same manner, the pedestal 114 may be negatively biased by a variable RF power source 401 to bias the substrate 112 negatively to attract the ionized deposition material to the substrate 112. In an alternative embodiment, the pedestal 114 may be biased by a high frequency AC power source to bias the substrate 112 so as to attract the ionized deposition material more uniformly to the substrate 112. In yet another alternative embodiment, external biasing of the substrate 112 may be omitted.

Figure 4:
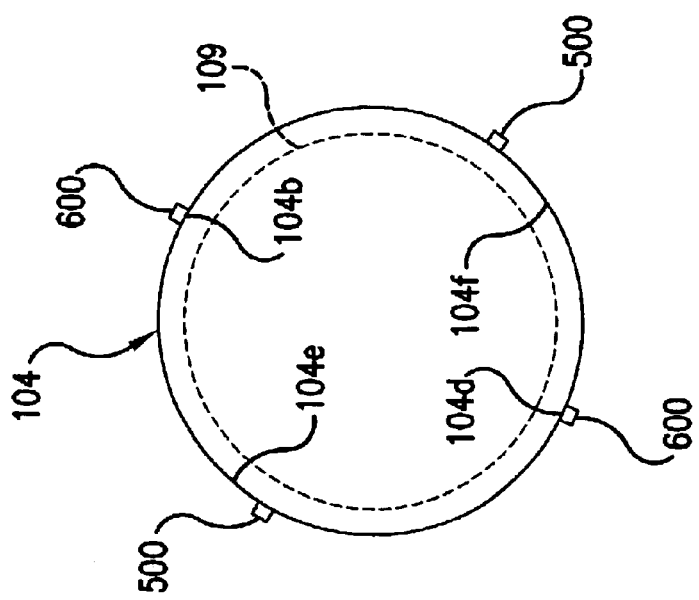
FIG. 4 is a top schematic view of the coil of FIG. 1.

In the embodiment of FIGS. 3 and 4, the coil 104 is a closed loop coupled at one point 104b through the shield 106 via a feedthrough standoff 600 toga source of RF energy. The RF energy is provided at the output of an amplifier and impedance-matching network 402, the input of which is coupled to the RF generator 404 which generates RF power at approximately 4.5 kW for this embodiment. A second connection point 104d of the coil 104 is coupled through the shield 106 via a similar feedthrough standoff 600 to ground, preferably through a blocking capacitor 406, which may be a variable capacitor to provide a DC bias on the coil 104. By controlling the DC bias on the coil 104, the coil sputtering rate may be substantially influenced. As described in U.S. Pat. No. 6,375,810, the DC bias on the coil 104 may be affected by a DC power source coupled to the coil 104. Appropriate RF blocking filters may be provided to eliminate or educe substantially RF current flowing to through the DC source. Suitable DC power ranges for coil sputtering include 50 watts to 10 kWatts, for example. One power level believed suitable for a variety of coil sputtering applications is 500 watts, for example. The power levels of the sources may vary of course, depending upon the particular application.

The amplifier and impedance-matching network 402 adjust the combined impedances of the RF coil 104 and the network 402 to match the impedance of the RF generator 404 so that RF energy will be efficiently transmitted from the RF generator 404 to the RF coil 104 rather than being reflected back to the generator 404. In accordance with the aforementioned U.S. Pat. No. 6,368,469 issued Apr. 9, 2002 and assigned to the assignee of the present application, the coil 104 may also be positioned and biased in such a manner that the coil may sputter as well as the target. As a result, the deposited material may be contributed by both the target and the coil. Such an arrangement is believed to improve the uniformity of the deposited layer.

Figure 8:
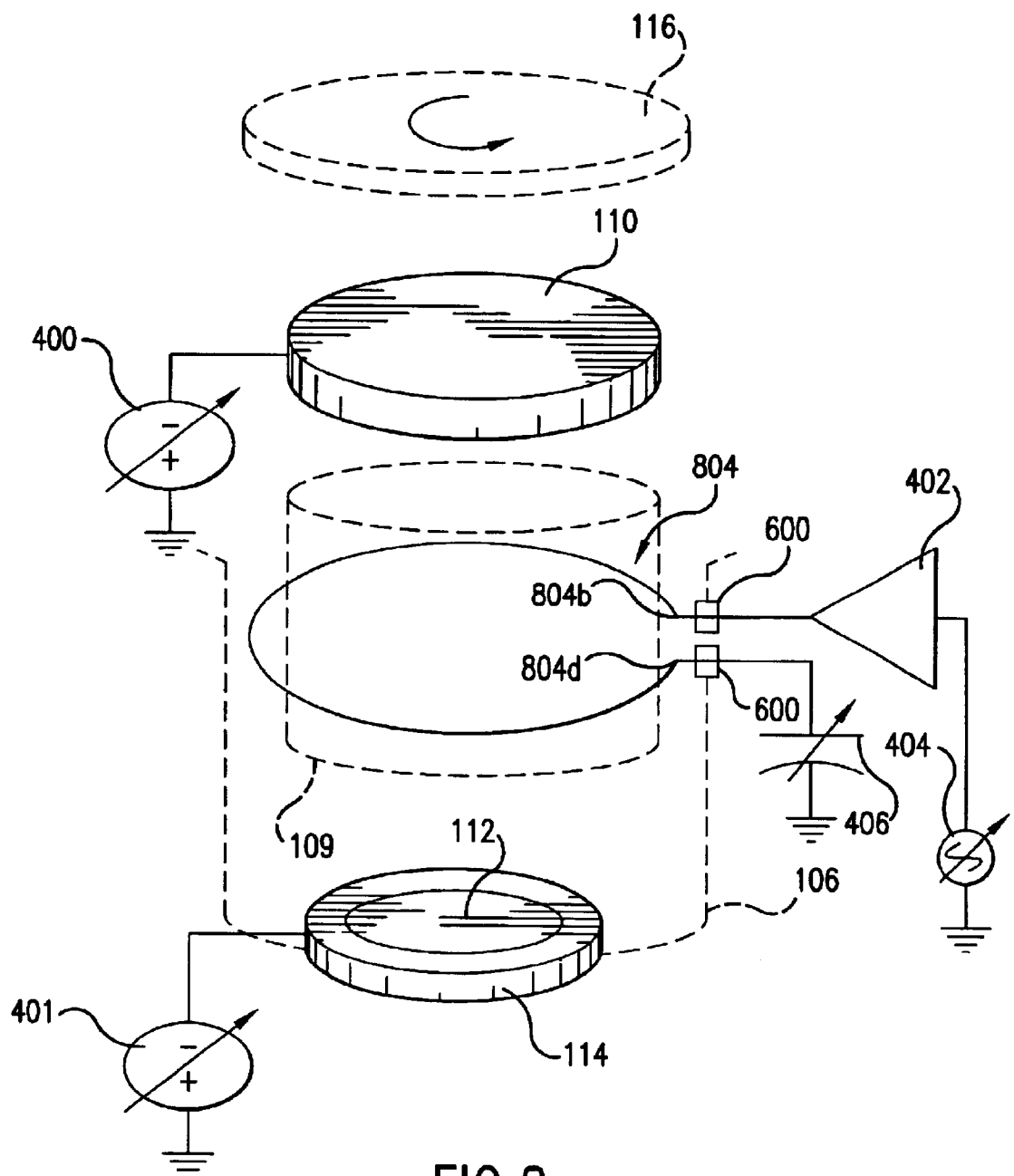
FIG. 8 is a schematic diagram of the electrical interconnections to a prior art sputter deposit coil.

As set forth above, it has been noted that the RF voltage distributions along a plasma generation coil can influence various properties of the plasma. These plasma properties including the plasma density and potential profiles, and ion bombardment of the coil and substrate being deposited. FIG. 8 shows an example of a prior art coil 804 which is a single turn coil substantially encircling the central plasma generation area 109 of the chamber. Because the instantaneous RF voltage distributions along the coil 104 are not uniform and are not axially symmetric about the symmetry axis of the coil 104, nonuniform and asymmetrical heating of both the coil 104 and the substrate 112 can occur as well as nonuniform sputtering of the coil and deposition of material on the substrate 112. Thus, nonuniform and asymmetrical heating of the coil 804 can cause reliability problems, in that portions of the coil 104 may become too hot and deform, and may also lead to the flaking of particulates deposited on the coil 804 which can contaminate the substrate 112. The nonuniform and asymmetrical instantaneous RF voltage distributions along the coil 804 and the consequent nonuniform effects can be more prominent when the coil 804 is a single turn coil as shown in FIG. 8.

In accordance with the present invention, a plasma generation coil which includes one or more partial turn coils can substantially reduce the maximum RF voltage applied across the partial turn coils and hence can reduce or alleviate nonuniform and asymmetrical heating of the coils. In the embodiment of FIGS. 3 and 4, the coil 104 although formed as a closed, single loop conductor, in effect, functions as two half-turn coils 104e and 104f connected together at diametrically opposed connection points 104b and 104d.

For example, the coil 804 of FIG. 8 may be considered to have an inductance L between the coil connection points 804b and 804d. If the open loop coil 804 and the closed loop coil 104 of FIG. 3 have a similar perimeter length and cross-sectional size, the inductance of each of the half turn coils 104e and 104f of the coil 104 would be L/2 since each half turn is half the length of the whole coil. As shown in FIG. 3, the two half-turn coils 104e and 104f are effectively coupled in parallel at the two connection points 104b and 104d. As a consequence, the effective inductance of the coil 104 between the two connection points 104b and 104d is L/4:

$$\frac{\left(\frac{L}{2}\right)^2}{\frac{L}{2}+\frac{L}{2}} = \frac{\frac{L^2}{4}}{L} = \frac{L}{4}$$

where the inductance of each half turn is L/2. Thus, if the maximum RF voltage on the coil 804 is $V_{max}$ where $$V_{max} = I\omega L$$

for a given current I and a given frequency of operation $\omega$, the maximum RF voltage applied across each half-turn coil 104e or 104f can be reduced to $V_{max}/4$:

$$I\omega\left(\frac{L}{4}\right) = \frac{I\omega L}{4} = \frac{V_{max}}{4}$$

In this manner, the maximum RF voltage exhibited by the coil 104 can be reduced by a factor of four as compared to that of the coil 808. As a consequence, nonuniform and asymmetrical heating of the coil may be correspondingly reduced.

The half-turn coil 104e of the coil 104 partially surrounds the central plasma generation area 109. As best seen in FIG. 4, the half-turn coil 104e of the illustrated embodiment surrounds approximately one half the central plasma generation area 109. Thus, the half-turn coil 104e has a length which is at least one half the outer perimeter of the central plasma generation area 109. Similarly, the half turn coil 104f of the coil 104 surrounds approximately one half of the central plasma generation area. In this manner, the outer perimeter of the central plasma generation area 109 is substantially encircled by the combined half turn coils 104e and 104f.

The coil 104 of the illustrated embodiment is a generally annular-shaped, closed loop ribbon coil. The RF generator and the blocking capacitors are coupled to the coil 104 at the diametrically opposed connection points 104b and 104d through RF feedthroughs 600 schematically represented in FIGS. 3 and 4. The center of each half turn coil is supported on the shield wall 140 (FIG. 2) by a pair of diametrically opposed standoffs 500 as shown FIGS. 2 and 4. It should be appreciated that the number and spacing of the standoffs may be varied depending upon the particular application.

Figure 5:
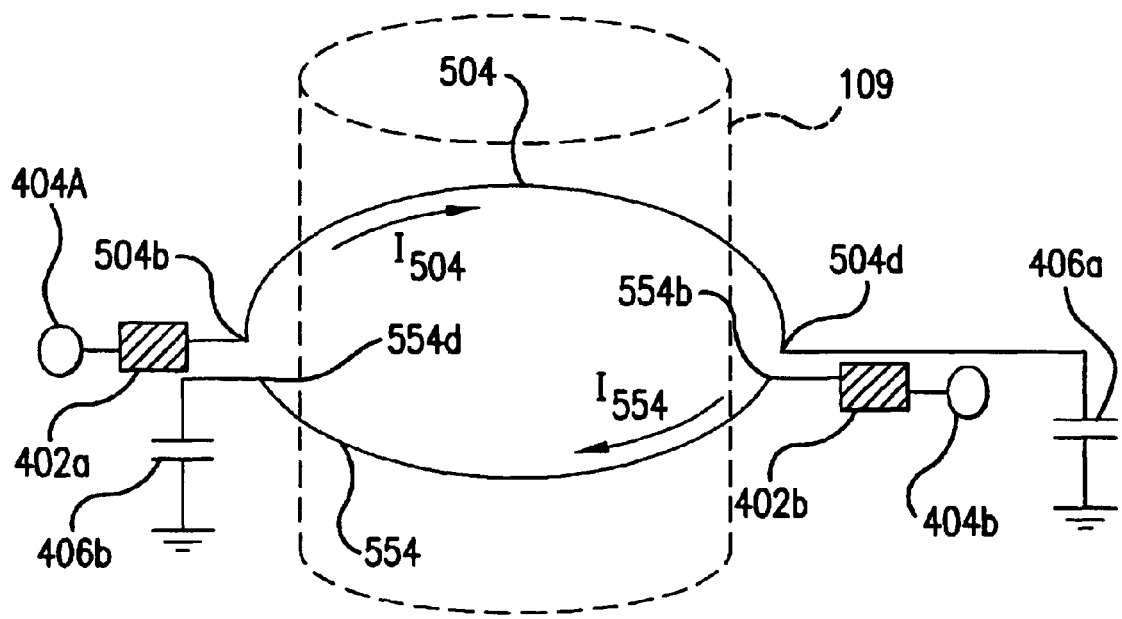
FIG. 5 is a schematic diagram of the electrical interconnections to a coil in accordance with an alternative embodiment.

FIG. 5 shows an alternative embodiment which includes two separate, arcuate-shaped, halt turn coils 504 and 554. In this embodiment, each half turn coil is driven separately by different RF generators. Thus, the half turn coil 504 is coupled at one end 504b to an RF generator 404a through a match circuit 402a. The other end 504d of the half turn coil 504 is coupled to ground through a blocking capacitor 406a. In a similar manner, the half turn coil 554 is coupled at one end 554b to an RF generator 404b through a match circuit 402b. The other end 554d of the half turn coil 554 is coupled to ground through a blocking capacitor 406b. Although the partial turn coils are depicted as half-turn coils, it should be appreciated that other fractional lengths are possible, including one-quarter, three-quarter and other fractions as well. These fractional lengths may also be expressed in terms of angular degrees. Thus a three quarter turn coil has an arcuate length of approximately 270 degrees. In many applications an arcuate length of 270 degrees or less is suitable. If a conductor ring or arcuate member has two RF connection points which are diametrically opposed, each half turn coil formed between the connection points has an arcuate length of approximately 180 degrees.

If the open loop coil 804 and the half turn coils 504 and 554 have a similar cross-sectional size and the perimeter length of the coil 804 is similar to the combined lengths of the half turn coils 504 and 554, the inductance of each of the half turn coils 504 and 554 would be L/2 since each half turn is half the length of the whole coil 808. As shown in FIG. 5, each half turn coil is in a separate circuit in which the current in each half may be represented as $I_{504}$ and $I_{554}$, respectively. If the current ($I_{504}$, $I_{554}$) in each half turn coil is the same as the current I through the single turn coil 804 then:

$$I_{504} = I_{554} = I$$

Thus, the maximum RF voltage applied across each half-turn coil 504 can be reduced to $V_{max}/2$:

$$I_{504\omega}\left(\frac{L}{2}\right) = \frac{I\omega L}{2} = \frac{V_{max}}{2}$$

The maximum RF voltage on half-turn coil 554 can be calculated in a similar manner as $V_{max}/2$. Thus, the maximum RF voltage exhibited by either of the half turn coils 504 or 554 can be reduced by a factor of two as compared to that of the coil 808. Although this reduction is not as great as that of the coil 104 discussed above, it is believed that the arrangement of the separate half turn coils 504 and 554 of FIG. 5 can have certain advantages.

For example, as shown in FIG. 5, the RF generators 404a and 404b are coupled to the two half turn coils 504 and 554 so that the two currents $I_{504}$ and $I_{554}$ can flow in the same clockwise (or counterclockwise) direction around the periphery of the central plasma generation area. As a result, if the RF generators 404a and 404b are operated so that the currents $I_{504}$ and $I_{554}$ are coherent with respect to each other, it is believed that the RF electro-magnetic fields generated by the half turn coils 504 and 554 at the center of the chamber may be stronger as compared to that provided by the coil 104 due to reduced interference between the two coil halves.

Figure 6:
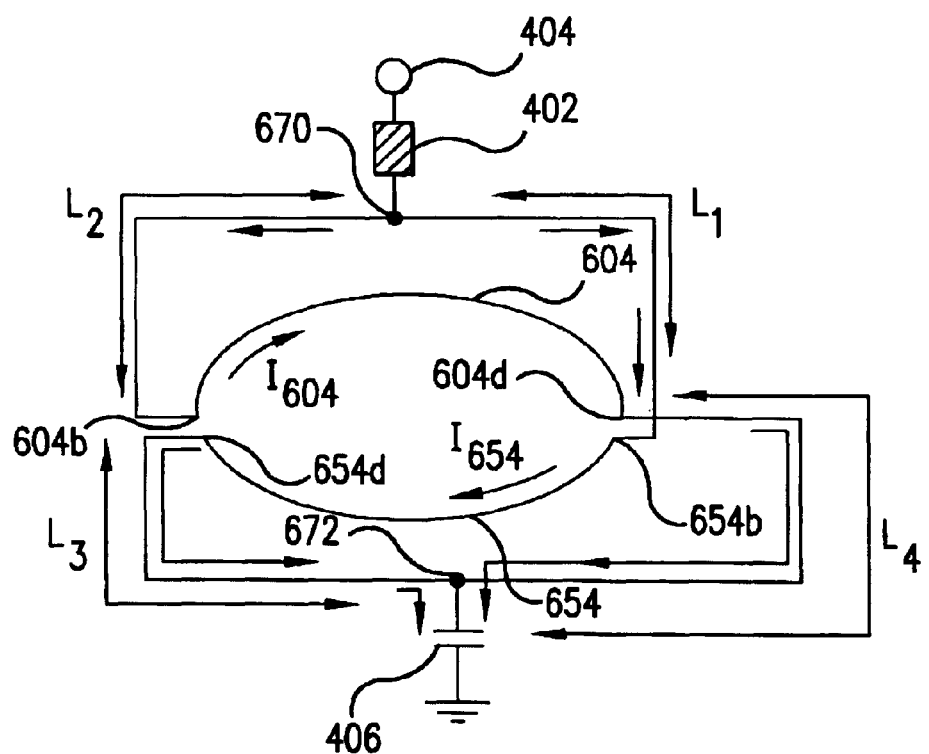
FIG. 6 is a schematic diagram of the electrical interconnections to a coil in accordance with yet another alternative embodiment.

FIG. 6 shows yet another alternative embodiment, which includes two separate half turn coils 604 and 654. In this embodiment, however, each half turn coil is driven by a common RF generator 404. Thus, the half turn coil 604 is coupled at one end 604b to an RF generator 404 through a match circuit 402. The other end 604d of the half turn coil 604 is coupled to ground through a blocking capacitor 406. In a similar manner, the half turn coil 654 is coupled at one end 654b to the same RF generator 404 through the same match circuit 402. The other end 654d of the half turn coil 654 is coupled to ground through the same blocking capacitor 406.

Here, the half turn coils 604 and 654 each have an inductance of L/2 like that of the half turn coils 504 and 554. However, because the half turn coils 604 and 654 are in parallel branch circuit paths from the common RF generator 404, the current $I_{604}$ through the half turn coil 604 is one half that of the current I through the coil 804 of FIG. 8. Consequently the maximum RF voltage on half-turn coil 604 can be reduced to $V_{max}/4$:

$$I_{604\omega}\left(\frac{L}{2}\right) = \left(\frac{I}{2}\right)\omega\left(\frac{L}{2}\right) = \frac{I\omega L}{4} = \frac{V_{max}}{4}$$

The maximum RF voltage on half-turn coil 654 can be calculated in a similar manner as $V_{max}/4$. Thus, the maximum RF voltage exhibited by either of the half turn coils 604 or 654 can be reduced by a factor of four as compared to that of the coil 808 and by a factor of two as compared to the two half coils 504 and 554 of FIG. 5.

Moreover, if the currents $I_{604}$ and $I_{654}$ are coherent with respect to each other, it is believed that the RF electromagnetic fields generated by the half turn coils 604 and 654 at the center of the chamber may in a manner similar to that of the half turn coils 504 and 554 of FIG. 5, be stronger as compared to that provided by the coil 104 due to reduced interference between the two coil halves. To facilitate maintaining coherency between the half turn currents $I_{604}$ and $I_{654}$, the separate current paths between the common RF generator connection point 670 and the common blocking capacitor connection point 672 may be maintained as equal as possible. Thus, if the lengths of the two half turn coils 604 and 654 are equal, the length $L_1$ between the half turn coil connection point 654b and the common RF generator connection point 670 can be made equal to the length $L_2$ between the half turn coil connection point 604b and the common RF generator connection point 670. In a similar manner, the length $L_3$ between the half turn coil connection point 654d and the common blocking capacitor connection point 672 can be made equal to the length $L_4$ between the half turn coil connection point 604d and the common blocking capacitor connection point 672.

The separate half-turn coils of the embodiments of FIGS. 5 and 6 each partially surrounds the central plasma generation area 109. Thus, in the illustrated embodiment of FIG. 5, for example, the half-turn coil 504 surrounds approximately one half of the outer perimeter of the central plasma generation area 109. Thus, the half-turn coil 504 has a length approximately one half the outer perimeter of the central plasma generation area 109. Similarly, the half turn coil 554 surrounds approximately one half of the central plasma generation area. The ends 504b and 554d of the coils 504 and 554, respectively, are preferably positioned close together but spaced apart. Similarly, the ends 504d and 554b of the coils 504 and 554, respectively, are preferably positioned close together but spaced apart. In this manner, the perimeter of the central plasma generation area 109 may be substantially encircled by the combined half turn coils 504 and 554.

Figure 7:
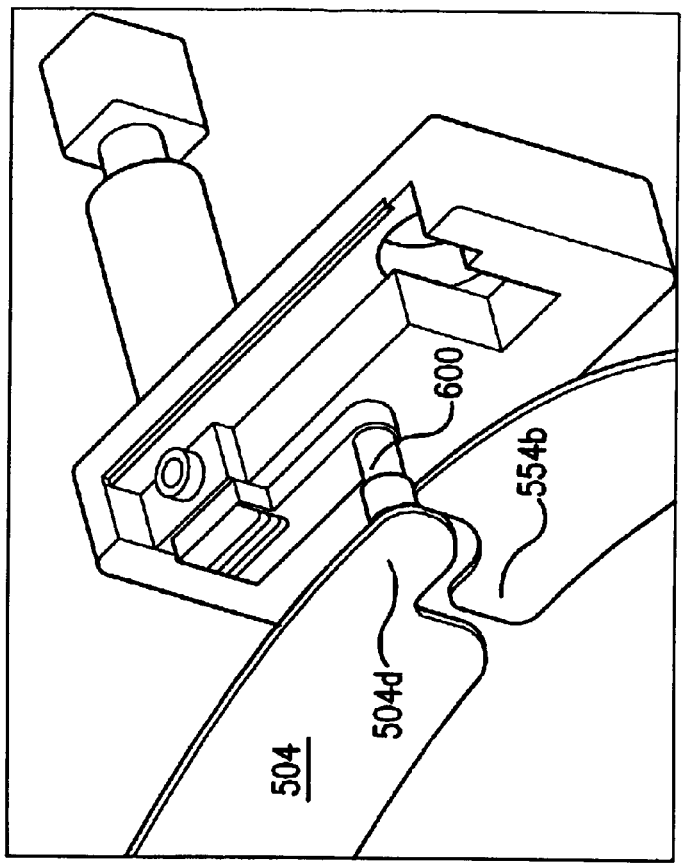
FIG. 7 is a perspective view of a coil feedthrough standoff for the coil of FIG. 5.

To provide a more complete encircling of the central plasma generation area, the ends such as ends 504d and 554b of the coils 504 and 554, respectively, may be positioned in an overlapping but spaced relationship as shown in FIG. 7. In this arrangement, the feedthrough standoffs 600 for each end may be stacked in a direction parallel to the plasma chamber central axis between the vacuum chamber target 110 and the substrate holder 114. As a consequence, the RF path from one end of one coil to the end of another coil can similarly overlap and thus avoid a gap over the wafer. It is believed that such an overlapping arrangement can improve uniformity of plasma generation, ionization and deposition.

As described in U.S. Pat. Nos. 6,345,588 issued Feb. 12, 2002 and 6,254,738 issued Jul. 3, 2001, which are assigned to the assignee of the present application, selected parameters of the RF generators 404, the match circuits 402 and the blocking capacitors 406 may be varied in repeating cycles during a sputtering or other plasma operation to vary or move the RF voltage distributions along the RF coil 104, and thereby also rotate the ionization profile of the plasma. For example, the capacitance of the blocking capacitor 406, a reactance of the matching circuit 402 or the frequency of the RF generator 404 may be cyclicly varied to sweep the RF voltage profile along the coil. As the voltage profile is varied to continuously or repeatedly move the minimum, peak or other reference points of the voltage around the coil in an orbital or other path about the plasma region, the regions of plasma having varying ionization fractions, or rates may in effect rotate about an axis within the plasma region. As a consequence, the RF coil 104 and substrate 112 can be more uniformly and axially symmetrically heated, and the target material can be more uniformly deposited, by time-averaging, because the regions of highest to lowest ionization fraction (or plasma density) can more equally contribute to sputtering of the coil and target.

In the illustrated embodiments discussed above, the partial turn coils when summed together provided approximately one full turn of a coil. It is appreciated that the partial turn coils may be operated together to provide, in effect, a multiple turn coil as well. Still further, instead of the ribbon shape of the coils illustrated, each partial turn of the coils may be implemented with fluid cooled tubular coils and other shapes as well.

Each of the partial turn coil embodiments discussed above may be operated together to function in effect as a single coil in the plasma chamber. It should be recognized that the present invention is applicable to plasma chambers having more than one RF powered coil. For example, the present invention may be applied to multiple coil chambers for launching helicon waves of the type described in U.S. Pat. Nos. 6,228,229 issued May 8, 2001 and 6,297,595 issued Oct. 2, 2001, which are assigned to the assignee of the present application.

The appropriate RF generators and matching circuits have components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary. For example, 1 MHz to 20 MHz is believed suitable. An RF power setting of 1.5 kW is preferred but a range of 1.5–5 kW is satisfactory. In addition, a DC power setting for biasing the target 110 of 8–12 kW is preferred but a wider range such as 2–24 kW may also be satisfactory. A pedestal 114 bias voltage of –30 volts DC is also suitable. Values for the above parameters will vary, depending upon the particular application.

A variety of sputtering gases may be utilized to generate the plasma including Ar, and a variety of reactive gases such as $NF_3$, $CF_4$, $H_2$, $O_2$ and many others may be used. Various sputtering gas pressures are suitable including pressures of 0.1–100 mTorr. For ionized PVD, a pressure between 10 and 50 mTorr often provides better ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A kit for use in a semiconductor fabrication chamber for generating a plasma for use in processing a substrate supported by a substrate holder within said chamber, the kit comprising:
   a shield wall shaped to protect at least a portion of the interior of said semiconductor fabrication chamber; said shield wall being adapted to be installed within said semiconductor fabrication chamber and having a central plasma generation area centered adjacent to said substrate holder when installed in said semiconductor fabrication chamber; and
   a first partial-turn coil and a second partial-turn coil, each partial-turn coil being insulatively carried by said shield wall and positioned to sputter coil material onto a substrate and to couple energy into said central plasma generation area to generate a plasma in said central plasma generation area when installed in said semiconductor fabrication chamber.

2. The kit of claim 1 wherein at least one partial turn coil is a half turn coil.

3. The kit of claim 1 wherein at least one partial turn coil is arcuate-shaped.

4. The kit of claim 1 wherein each partial turn coil is a half-turn coil.

5. The kit of claim 4, wherein each half-turn coil has a center positioned diametrically opposite the center of the other half-turn coil.

6. The kit of claim 4 wherein the central plasma generation area has an outer perimeter and each half-turn coil has a length at least as long as approximately one half the outer perimeter of the central plasma generation area.

7. The kit of claim 4 wherein each half-turn coil has a first end and a second end and each first end is adjacent the second end of the other coil.

8. The kit of claim 7 wherein each half-turn coil end has an RF feedthrough insulatively supporting the associated half-turn coil end on said shield wall.

9. The kit of claim 4 wherein each half-turn coil has a first end and a second end and each first end is electrically coupled to the second end of the other coil.

10. The kit of claim 9 wherein each end of a half-turn coil has an RF feedthrough insulatively supporting the associated half-turn coil end on said shield wall.

11. The kit of claim 1 further comprising a closed loop, conductive ring member which includes said first and second partial turn coils.

12. A semiconductor fabrication system for processing a substrate supported by a substrate holder, the system comprising:
   a semiconductor fabrication chamber having a central plasma generation area within said chamber and centered adjacent to said substrate holder; and
   a first partial-turn coil and a second partial-turn coil, each partial-turn coil being carried internally within said chamber and positioned to couple energy into said central plasma generation area to generate a plasma in said central plasma generation area and to sputter deposition material onto said substrate, wherein:
      each partial turn coil is a half-turn coil;
      each half-turn coil has a first end and a second end and each first end is adjacent the second end of the other coil;
      and further wherein said chamber has a shield wall encircling said central plasma generation area and each half-turn coil end has an RF feedthrough insulatively supporting the associated half-turn coil end on said shield wall.

13. The system of claim 12 wherein at least one partial turn coil is arcuate-shaped.

14. The system of claim 12 wherein each half-turn coil has a center positioned diametrically opposite the center of the other half-turn coil.

15. The system of claim 12 wherein the central plasma generation area has an outer perimeter and each halt-turn coil has a length at least as long as approximately one half the outer perimeter of the central plasma generation area.

16. The system of claim 12 wherein each half-turn coil has a first end and a second end and each first end is electrically coupled to the second end of the other coil.

17. The system of claim 12 further comprising a first RF source and a first blocking capacitor wherein each half-turn coil has a first end and a second end and the first end of the first half-turn coil is electrically coupled to said first RF source and the second end of the first half-turn coil is coupled to said first blocking capacitor.

18. The system of claim 12 further comprising a common RF source and a common blocking capacitor wherein the first end of the first half-turn coil and the first end of the second half-turn coil are electrically coupled to said common RF source and the second end of the first half-turn coil and the second end of the second half-turn coil are electrically coupled to said common blocking capacitor.

19. The system of claim 12 wherein said chamber includes a pressure vessel having an interior which includes said central plasma generation area and is adapted to maintain said pressure vessel interior at a pressure below atmospheric and said partial turn coils are positioned within said pressure vessel interior.

20. The system of claim 19 wherein said pressure below atmospheric is 10–50 mTorr.

21. A semiconductor fabrication system for processing a substrate supported by a substrate holder, the system comprising:

a semiconductor fabrication chamber having a central plasma generation area within said chamber and centered adjacent to said substrate holder; and a first partial-turn coil and a second Partial-turn coil, each partial-turn coil being carried internally within said chamber and positioned to couple energy into said central plasma generation area to generate a plasma in said central plasma generation area and to sputter deposition material onto said substrate, wherein each partial turn coil is a half-turn coil;

comprising a first RF source and a first blocking capacitor wherein each half-turn coil has a first end and a second end and the first end of the first half-turn coil is electrically coupled to said first RF source and the second end of the first half-turn coil is coupled to said first blocking capacitor; and further comprising a second RF source and a second blocking capacitor wherein the first end of the second half-turn coil is electrically coupled to said second RF source and the second end of the second half-turn coil is coupled to said second blocking capacitor.

22. An apparatus for processing a substrate in a semiconductor fabrication system, comprising:

a vacuum pressure vessel which defines an exterior and an interior;

a first partial turn coil disposed within said interior and having a first end, a second end and a sputtering surface disposed along said coil between said first and second ends and adapted to sputter coil material onto a substrate in said vessel; and a second partial turn coil disposed within said interior and having a first end, a second end and a sputtering surface disposed along said coil between said first and second ends of said second coil and adapted to sputter coil material onto said substrate in said vessel;

a first RF power source positioned on the exterior of said pressure vessel and coupled to the first end of said first coil;

a first blocking capacitor positioned on the exterior of said pressure vessel and coupled to the second end of said first coil;

a second RF power source positioned on the exterior of said pressure vessel and coupled to the first end of said second coil; and a second blocking capacitor positioned on the exterior of said pressure vessel and coupled to the second end of said second coil.

* * * * *